United States Patent [19]

Nagel et al.

[11] Patent Number: 5,289,395
[45] Date of Patent: Feb. 22, 1994

[54] SIGNAL PROCESSING METHOD EMPLOYING A DIGITAL FILTER

[75] Inventors: Dieter Nagel; Günter Wolf, both of Ulm, Fed. Rep. of Germany

[73] Assignee: Telefunken Systemtechnik AG, Ulm, Fed. Rep. of Germany

[21] Appl. No.: 919,240

[22] Filed: Jul. 27, 1992

[30] Foreign Application Priority Data

Jul. 26, 1991 [DE] Fed. Rep. of Germany ....... 4124834

[51] Int. Cl.$^5$ .............................................. G06F 15/31
[52] U.S. Cl. .................................................. 364/724.01
[58] Field of Search .............. 364/724.01, 724.02, 364/724.03, 724.08, 724.15, 724.17, 724.19, 724.2

[56] References Cited

U.S. PATENT DOCUMENTS

| | | | |
|---|---|---|---|
| 3,749,895 | 7/1973 | Kao | 364/724.03 X |
| 4,912,667 | 3/1990 | Rabenstein | 364/724.13 |
| 4,920,507 | 4/1990 | Takeda | 364/724.03 X |

OTHER PUBLICATIONS

Alan V. Oppenheim et al., *Digital Signal Processing*, "Flow Graph and Matrix Representation of Digital Filters", Prentice Hall, Inc. 1975, pp. 149–153.

Primary Examiner—Long T. Nguyen
Assistant Examiner—Chuong Ngo
Attorney, Agent, or Firm—Spencer, Frank & Schneider

[57] ABSTRACT

A method is disclosed for processing a signal having a monochromatic signal component with the aid of a digital filter. The method includes determining the real amplitude, phase and frequency of the monochromatic signal component of the signal. The signal is delayed for a time during which states of the digital filter are set to correspond to the determined real amplitude, the phase and the frequency of the monochromatic signal component. The signal is then applied to the input of the digital filter only after the states of the digital filter are set.

6 Claims, 6 Drawing Sheets

SIGNAL PROCESSING METHOD EMPLOYING A DIGITAL FILTER

CROSS REFERENCE TO RELATED APPLICATIONS

The present application claims the rights of priority with respect to application Ser. No. P 41 24 834.1 filed Jul. 26, 1991, in Germany, the subject matter of which is incorporated herein by reference.

BACKGROUND OF THE INVENTION

The present invention relates to a method of processing a signal having a monochromatic signal component with the aid of a digital filter for suppressing the monochromatic signal component.

Such an electrical signal is encountered, for example, in communication transmissions that are effected with the aid of a so-called carrier signal. The carrier signal in a communications receiver serves merely to tune the receiver to a desired communications transmitter. For an evaluation of the data, the carrier signal must be suppressed at the receiving end since it contains no communication information. In this context, the carrier signal can also be called the monochromatic signal component of the entire signal which should be suppressed as well as possible by means of a filter, for example, a digital filter. Such a filter has a more or less long transient period. The transient period, however, generally does not pose a problem since it at most prevents evaluation of the data for a short time, for example whenever the communications receiver is tuned from a first carrier signal (first transmitter) to a second carrier signal (second transmitter). In that case reliable evaluation of the data of the second transmitter, mentioned as an example, can take place only after the transient period of the filter for the monochromatic signal component. If the carrier signal changes only rarely, the transient period of the filter involved is also negligible. If, however, the carrier signal is interrupted relatively frequently, for example, due to switching processes, the transient period of the filter may cause an annoying loss of a considerable portion of the communication information.

SUMMARY OF THE INVENTION

It is therefore an object of the present invention to improve a method of the above type so that a digital filter is given a negligible transient period.

The above and other objects are accomplished in accordance with the invention by the provision of a method of processing a signal having a monochromatic signal component with the aid of a digital filter, comprising steps of: determining real amplitude, phase and frequency of the monochromatic signal component of the signal; delaying the signal and setting states of the digital filter to correspond to the determined real amplitude, phase and frequency of the monochromatic signal component while the signal is delayed; and applying the signal to the input of the digital filter only after the setting step is completed.

A first advantage of the invention is that, under certain conditions, it is possible to realize a filter that has a zero transient period for the monochromatic signal component.

A second advantage is that, due to the short transient period of the filter for the monochromatic signal component, it is possible to employ the filter whenever a pulsed (switched) carrier signal, which is also called a burst, must be reliably suppressed.

A third advantage is that in signal processing methods which are based on the use of pulsed carrier signals (bursts), the length of time of the bursts can be shortened considerably while reliable signal evaluation is still obtained.

The invention is based on the surprising realization that it is possible to configure a digital filter that is designed as an IIR filter (Infinite Impulse Response filter), that is, a filter having a nominally infinitely long pulse response period, so that this IIR filter has a negligible transient period for a monochromatic signal component, with the transient period, under certain conditions that will be discussed in detail below, possibly even going down to exactly zero.

In principle, a digital filter includes several series-connected delay members through which the input signal passes in timely succession. Thus, several time delayed signals are generated which are weighted according to the desired filter characteristics; that is, the time delayed signals are multiplied by a factor, and then added.

As already mentioned, an IIR filter has a nominally infinitely long time pulse response whose signal amplitude in an electrically stable filter system tends to approach the cutoff value of zero after an infinitely long time. In IIR filters realized in industry, the signal amplitude decays after a predetermined time, for example a few seconds, to a predetermined value, for example one one-hundredth of the initial value, so that the transient process is considered to be completed after this time. The output values (output amplitudes) are a function of the corresponding input values (input amplitudes) and of the so-called state vector (memory) of the IIR filter. If, for example, the input signal of the IIR filter is a monochromatic oscillation which is suddenly switched in at a certain predetermined point in time, that is, which changes from the amplitude value of zero to a predetermined maximum amplitude value, a state vector characterizing the IIR filter develops a curve corresponding to the monochromatic signal component only after the mentioned long transient period.

If, at the moment at which the monochromatic oscillation is suddenly switched to the input of the IIR filter, the amplitude, phase and frequency of the oscillation are already known, it is possible to determine with the aid of the likewise known transfer function of the IIR filter, a state vector that corresponds to the state after the transient period. If now, before the point in time of the sudden switching in of the monochromatic oscillation, the IIR filter is set to a corresponding state vector, the IIR filter is already in its steady state when the switching in occurs and thus has a zero transient period. Amplitude, phase and frequency of the oscillation can be determined, for example, by way of a measuring arrangement that will be discussed in detail below.

It is thus possible, for example, to measure, by way of an arrangement connected to the input of the IIR filter the amplitude, phase and frequency of a time keyed carrier signal (burst) and to delay the burst until the mentioned state vector has been determined. Thereafter, the IIR filter is set to this state vector. Only then is the burst applied to the input of the filter which is then in the steady state for the monochromatic signal component. If the IIR filter is now, for example, configured as a blocking filter for the monochromatic signal component, only the desired signal components are present at the output of the IIR filter, for example the signal components corresponding to one sideband of the carrier signal, which include the data to be evaluated.

The present invention will now be described in greater detail with reference to embodiments thereof which are schematically illustrated in the drawing figures.

DETAILED DESCRIPTION OF THE PREFERRED EMBODIMENTS

Figure 1:
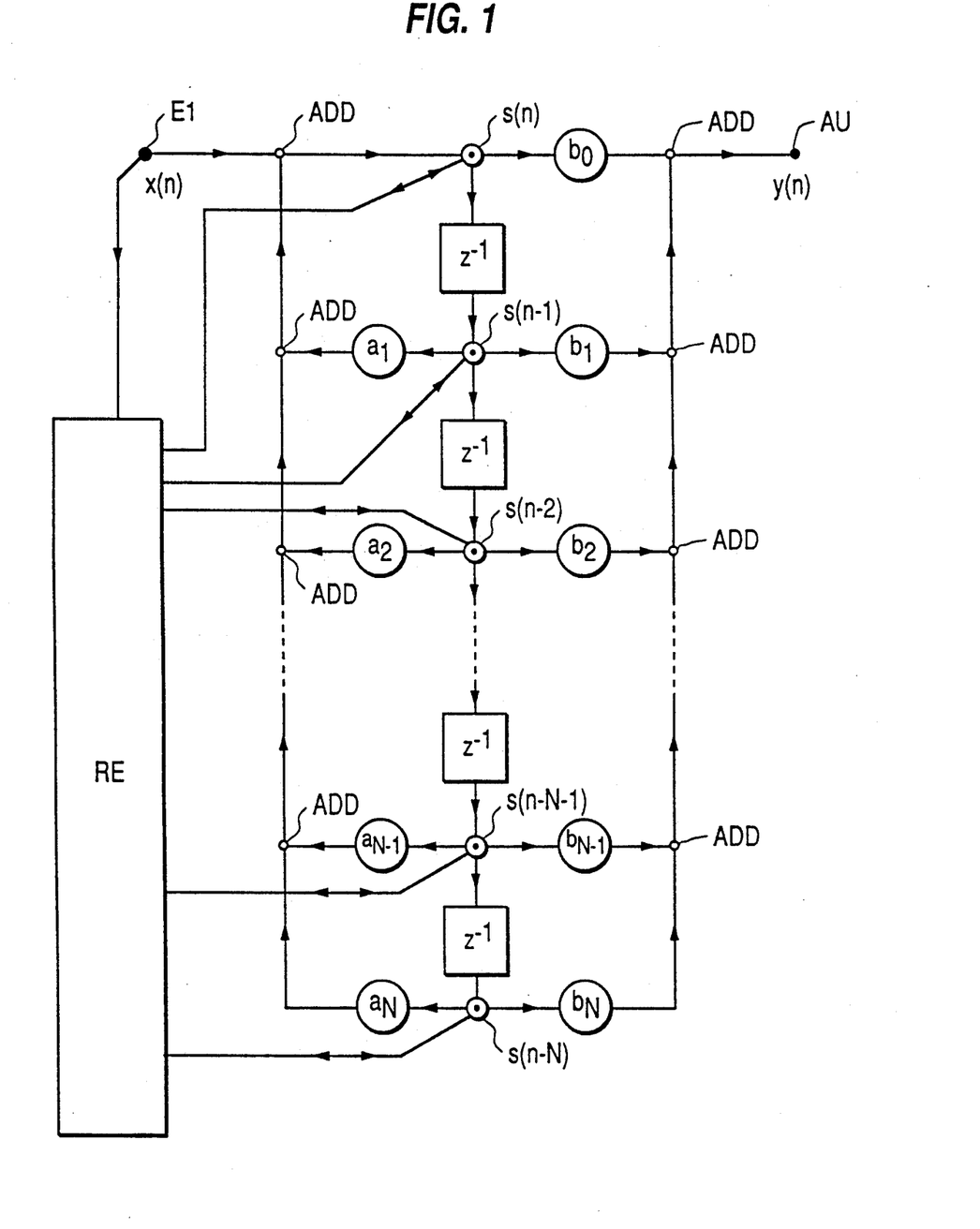
FIG. 1 is a schematic block circuit diagram of a first embodiment of a recursive IIR filter in the second direct form including a minimum number of multiplication members.

Referring to FIG. 1, there is shown an IIR filter in the second direct form which is essentially composed of a series connection of delay members $z^{-1}$ which all have the same delay time. An IIR filter in the second direct form is known from literature, e.g. from the book A. V. Oppenheim, R. W. Schafer, Digital Signal Processing, Prentice Hall Inc. 1975, pages 149 to 153. At the inputs and outputs of delay members $z^{-1}$ there are adjustable multiplication members $s(n)$ to $s(n-N)$ in the form of adjustable (programmable) memory elements which are advantageously set with the aid of a calculating unit RE. Connected to their outputs are fixed multiplication members $a_1$ to $a_N$ as well as $b_0$ to $b_N$ which serve to set the filter coefficients and thus the characteristic of the filter. The outputs of the fixed multiplication members are connected to addition members ADD for producing the grid-shaped arrangement shown in FIG. 1. Arrows indicate the signal flow. From an input signal $x(n)$ present at filter input EI, an output signal $y(n)$ is produced at filter output AU. Advisably, $x(n)$ and $y(n)$ are present as digital sampled values of a time-dependent function. The number of the sampled value is marked n so that n is also a measure of the time.

The operation of such an IIR filter will now be described with the aid of a z-transform as is customary in the communications art, where z is a complex variable (operand) from the z domain (z plane). The z-transforms $X(z)$ and $Y(z)$ are associated with the input signal $x(n)$ and the output signal $y(n)$, respectively. The recursive IIR filter according to FIG. 1 can be expressed by the rational transfer function $H(z)$ according to the following equation:

$$H(z) = \frac{\sum_{k=0}^{N} b_k z^{-k}}{1 - \sum_{k=1}^{N} a_k z^{-k}} \quad (1)$$

where k is a running variable and N is the so-called length of the filter. N also equals the number of delay members $z^{-1}$ and the number of adjustable multiplication members $s(n)$ to $s(n-N)$ which in the mathematical representation are also called states. $a_k$ and $b_k$ identify the already mentioned filter coefficients which can also be realized as fixed multiplication members.

The output signal $y(n)$ is a function of the input signal $x(n)$ and the N states $s(n-1)$, $s(n-2)$, ..., $s(n-N)$ according to the following equations:

$$y(n) = \sum_{k=0}^{N} b_k s(n-k) \quad (2a)$$

$$s(n) = x(n) + \sum_{k=1}^{N} a_k s(n-k) \quad (2b)$$

In this case, the state $s(n)$ at time n can be expressed according to Equation (2b) by the input signal $x(n)$ and all other state values. A transfer function between the state $s(n)$ with the associated z-transform $S(z)$ and the input signal $x(n)$ with the associated z-transform $X(z)$ is determined from the following equation:

$$S(z) = \frac{1}{1 - \sum_{k=1}^{N} a_k z^{-k}} X(z) \quad (3)$$

The values of states $s(n-i)$ at times $n-i$, where $i=1, \ldots, N$, can be determined in the z domain by multiplication of Equation (3) by $z^{-i}$.

This means that a multiplication in the z-domain with $z^{-1}$ corresponds in the time domain to a time shift $$s(n-1) \circ\!\!-\!\!\cdot S(z) z^{-1}$$

$$s(n-i) \circ\!\!-\!\!\cdot S(z) z^{-i} \quad (4)$$

where $\circ\!\!-\!\!\cdot$ is a symbol for the associated z-transform.

Figure 2:
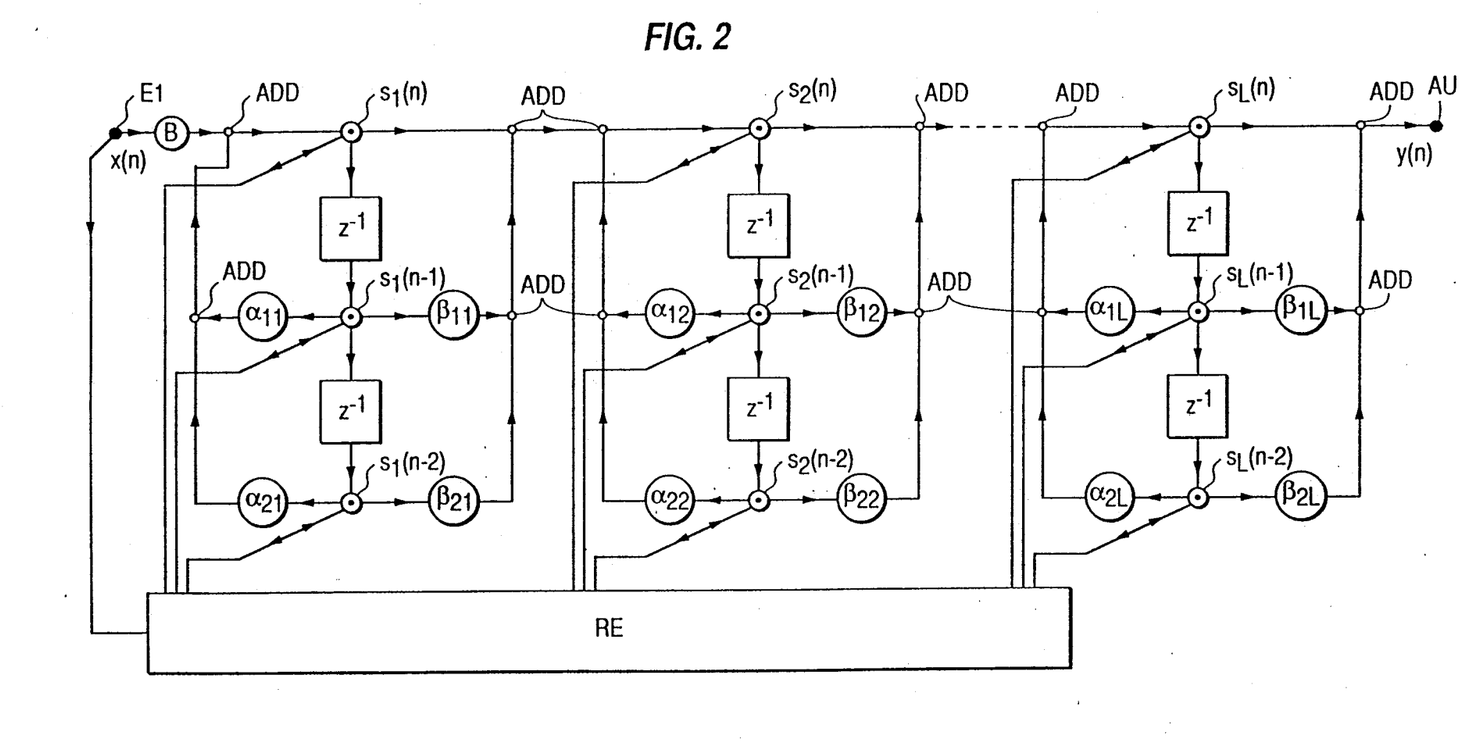
FIG. 2 is a schematic block circuit diagram of a second embodiment of an IIR filter including a cascade connection of several subsystems which are likewise constructed in the second direct form according to FIG. 1.

FIG. 2 shows a further embodiment of an IIR filter which has a so-called cascade structure. This structure includes a series connection of a number L of sub-systems which are configured as second order systems and are likewise realized in the second direct form. The reference numerals in FIG. 2 correspond to those of FIG. 1 but, because of the cascade structure, it is necessary to identify the adjustable multiplication members $s_k(n)$ as well as the fixed multiplication members $\alpha$, $\beta$ (filter coefficients) by a subscripted index k, where $k=1, \ldots, L$. The filter input EI is followed by a further fixed multiplication member B. The IIR filter of FIG. 2 can be described in the z domain by a transfer function $H(z)$ corresponding to Equation (1) as follows:

$$H(z) = B \prod_{k=1}^{L} \frac{1 + \beta_{1k} z^{-1} + \beta_{2k} z^{-2}}{1 - \alpha_{1k} z^{-1} - \alpha_{2k} z^{-2}} \quad (5)$$

$$L = INT\left[\frac{N+1}{2}\right]$$

where the function INT determines the largest integer of the bracketed term that follows it.

The output signal $y(n)$ appearing at the output AU of the IIR filter results from the states of the adjustable memory members $s_i(n-1)$, $s_i(n-2)$, where $i=1, \ldots, L$, and the input signal $x(n)$ as follows:

$$y(n) = s_L(n) + \beta_{1L}s_L(n-1) + \beta_{2L}s_L(n-2) \quad (6)$$

$$s_L(n) = s_{L-1}(n) + \beta_{1(L-1)}s_{L-1}(n-1) + \beta_{2(L-1)}s_{L-1}(n-2) + \alpha_{1L}s_L(n-1) + \alpha_{2L}s_L(n-2)$$

$$\vdots$$

$$s_2(n) = s_1(n)\beta_{11}s_1(n-1) + \beta_{21}s_1(n-2) + \alpha_{12}s_2(n-1) + \alpha_{22}s_2(n-2)$$

$$s_1(n) = Bx(n) + \alpha_{11}s_1(n-1) + \alpha_{21}s_1(n-2)$$

From this the transfer functions that are important for the IIR filter can be derived according to the following equations:

$$s_L(n) \circ\!\!-\!\!\bullet\ S_L(z) = \frac{1 + \beta_{1(L-1)}z^{-1} + \beta_{2(L-1)}z^{-2}}{1 - \alpha_{1L}z^{-1} - \alpha_{2L}z^{-2}} S_{L-1}(z) \quad (7)$$

$$\vdots$$

$$s_2(n) \circ\!\!-\!\!\bullet\ S_2(z) = \frac{1 + \beta_{11}z^{-1} + \beta_{21}z^{-2}}{1 - \alpha_{12}z^{-1} - \alpha_{22}z^{-2}} S_1(z)$$

$$s_1(n) \circ\!\!-\!\!\bullet\ S_1(z) = \frac{B}{1 - \alpha_{11}z^{-1} - \alpha_{21}z^{-2}} X(z)$$

Since only second-order filter systems exist in the L subsystems, all other states result from multiplication by $z^{-1}$ and $z^{-2}$ as follows:

$$s_l(n-1) \circ\!\!-\!\!\bullet\ S_l(z)z^{-1}$$

$$s_l(n-2) \circ\!\!-\!\!\bullet\ S_l(z)z^{-2}, \ l=1,\ldots,L \quad (8)$$

In the description so far the IIR filters according to FIGS. 1 and 2 were considered only in the z domain and the associated transfer functions were determined. The proper relationships will be established below with respect to real electrical signals and the associated parameters will be determined.

Any desired monochromatic signal characterized by the real amplitude A and the frequency $\omega_1$, sampled at the sampling frequency $f_a$, and switched in at the time $n=0$ can be described by the following equations:

$$x(n) = Ae^{j(\Omega_1 n + \Phi_1)} \text{ for } n \geq 0 \quad (9)$$

$$x(n) = 0 \text{ for } n < 0$$

$$j^2 = -1$$

where $\Phi_1$ is the phase at the moment of sampling, $n=0$, and $\Omega_1$ is the standardized frequency of the signal. $\Omega_1$ has no dimensions and corresponds to the frequency $\omega_1$ with reference to the sampling frequency $f_a$ according to the following equation:

$$\Omega_1 = \frac{\omega_1}{f_a} \quad (10)$$

If two complex sampling values x(0) and x(1) are present, they can be used to determine the parameters A, $\Omega_1$ and $\Phi_1$ as follows:

$$x(0) = Ae^{j\Phi_1}$$

$$x(1) = Ae^{j(\Omega_1 + \Phi_1)} \quad (11)$$

From this follows:

$$\Omega_1 = -j \ln \frac{x(1)}{x(0)} \quad (12)$$

$$A = |x(0)| = |x(1)|$$

$$\Phi_1 = -j \ln \frac{x(0)}{A}$$

where ln is a natural logarithm.

As already mentioned above, the attaining of the steady state on the part of the IIR filter is prevented in that its states, that is, the filter memory elements, are pre-occupied with certain values.

Figure 3A:
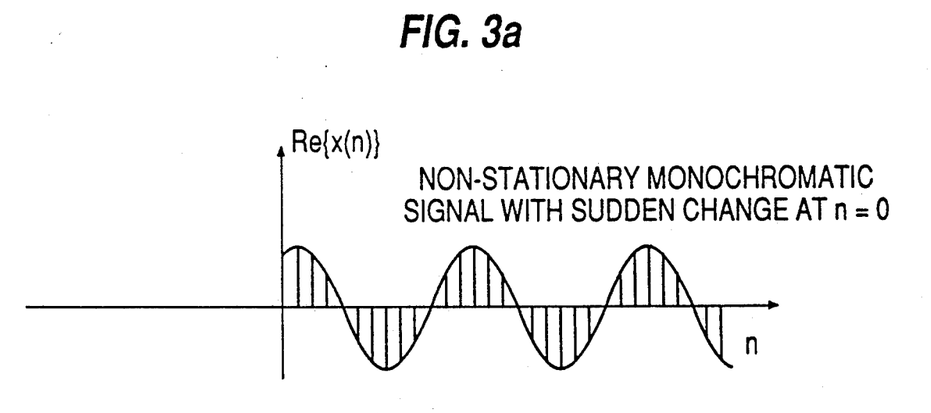
FIGS. 3a, 3b, 4a, 4b, 5a, 5b, 6a, 6b, 7a, 7b, 8a and 8b are signal diagrams used in explaining the principles of the invention.

If the filter is to be prevented from going through a transient period, the actual signal curve, which includes a sudden change at a defined point in time, must be fictively changed. This is done in that the monochromatic signal present after the sudden change is continued into the past as if no sudden change had happened. Thus, a stationary signal (FIG. 3b) is created from the non-stationary signal curve (FIG. 3a) according to Equation (9). The frequency response of the filter can therefore be utilized in the calculation of the state vector. With a calculation of the state vector it is possible to impress directly into the filter memory an event which actually would have occurred only after an infinitely long transient period.

Figure 3B:
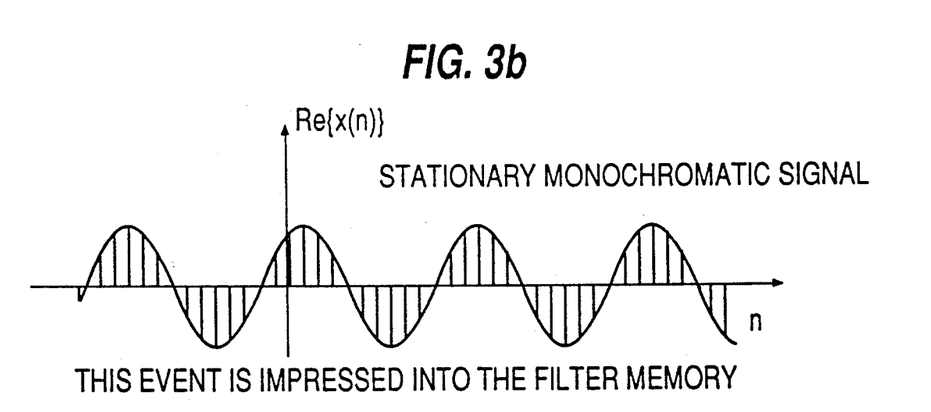

The signal shown in FIG. 3b is monochromatic over the range from $-\infty$ to $+\infty$. This is represented by a signal train $\hat{x}(n)$ according to the following equation:

$$\hat{x}(n) = Ae^{j(\Omega_1 n + \Phi_1)} \text{ where } -\infty < n < \infty \quad (13)$$

In the IIR filter of FIG. 1, the state s(n) and the input signal x(n) according to Equation (3) are linked together means of a transfer function. Since only the steady state s(n) is of interest here and x(n) is a monochromatic signal at frequency $\Omega_1$, the expression $z = e^{j\Omega_1}$ can be employed.

Thus, Equation (3) yields the following equation:

$$s(n) = \frac{1}{1 - \sum_{k=1}^{N} a_k e^{-j\Omega_1 k}} \cdot Ae^{j(\Omega_1 n + \Phi_1)} \quad (14)$$

According to Equation (11), the following applies:

$$x(0) = Ae^{j\Phi_1} \quad (15)$$

$$\frac{x(1)}{x(0)} = e^{j\Omega_1}$$

Thus, s(n) can be obtained directly as a function of x(0), x(1) and the filter coefficients $a_k$, where $k=1,\ldots,N$, as follows:

$$s(n) = \frac{1}{1 - \sum_{k=1}^{N} a_k \left[\frac{x(1)}{x(0)}\right]^{-k}} x(0) \left[\frac{x(1)}{x(0)}\right]^n \quad (16)$$

Consequently, the filter memory, that is, the state values s(−1), s(−2), ..., s(−N), can be determined with the aid of the first two sampled values x(0) and x(1) so that, if the monochromatic signal is suddenly switched in, the IIR filter is directly in its steady state.

The signal curves for states $s_l(n)$, $s_l(n-1)$ and $s_l(n-2)$, where $l=1,\ldots,L$, for the cascade structure according to FIG. 2 are somewhat more difficult to determine. This must be done successively. Starting with state $s_1(n)$, and analogous to Equation (16), the following is obtained from Equation (7):

$$s_1(n) = \frac{B}{1 - \alpha_{11}\left[\frac{x(1)}{x(0)}\right]^{-1} - \alpha_{21}\left[\frac{x(1)}{x(0)}\right]^{-2}} x(0)\left[\frac{x(1)}{x(0)}\right]^n \quad (17)$$

Now, employing the input signal train $\hat{x}(n)$ according to Equation (13), the signal curves for the states can all be expressed as complex oscillations:

$$s_l(n) = A_l e^{j(\Omega_1 n + \Phi_{ll})}, \text{ where } l=1,\ldots,L \quad (18)$$

If the individual transfer function $z = e^{j\Omega_1}$ is employed the following is obtained from Equation (7):

$$s_1(n) = \frac{1 + \beta_{1(l-1)}e^{-j\Omega_1} + \beta_{2(l-1)}e^{-j2\Omega_1}}{1 - \alpha_1 e^{-j\Omega_1} - \alpha_2 e^{-j2\Omega_1}} A_{l-1} e^{j(\Omega_1 n + \Phi(l-1)l)} \quad (19)$$

Using the following equations:

$$s_1(0) = A_l e^{j\Phi_{ll}} \quad (20)$$

$$\frac{x(1)}{x(0)} = e^{j\Omega_1}$$

it then follows that:

$$s_1(n) = \frac{1 + \beta_{1(l-1)}\left[\frac{x(1)}{x(0)}\right]^{-1} + \beta_{2(l-1)}\left[\frac{x(1)}{x(0)}\right]^{-2}}{1 - \alpha_{1l}\left[\frac{x(1)}{x(0)}\right]^{-1} - \alpha_{2l}\left[\frac{x(1)}{x(0)}\right]^{-2}} s_{l-1}(0)\left[\frac{x(1)}{x(0)}\right]^n \quad (21)$$

where
$l=2,\ldots,L$ and
$n=0,-1,-2$

With Equations (17) and (21) the memory of a filter in the cascade structure is determined if, upon a sudden switching in of a monochromatic signal, the filter is not to exhibit any transient behavior.

If input signal $x(n)$ includes only one monochromatic component, the states for avoiding transient behavior can be predetermined precisely. FIG. 4 shows the filter response to a suddenly switched in monochromatic signal for the example of a Cauer filter (fourth order, cascade structure) designed as a blocking filter for a monochromatic signal. Specifically, in FIG. 4a shows the transient behavior for the case where the states were not pre-occupied, that is, all memories $s(n)$ have the value of zero at time $n=0$.

FIG. 4b shows the case where all states according to Equations (17) and (21) were pre-occupied, from which it can be clearly seen that, advantageously, no transient behavior exists.

Figure 4A:
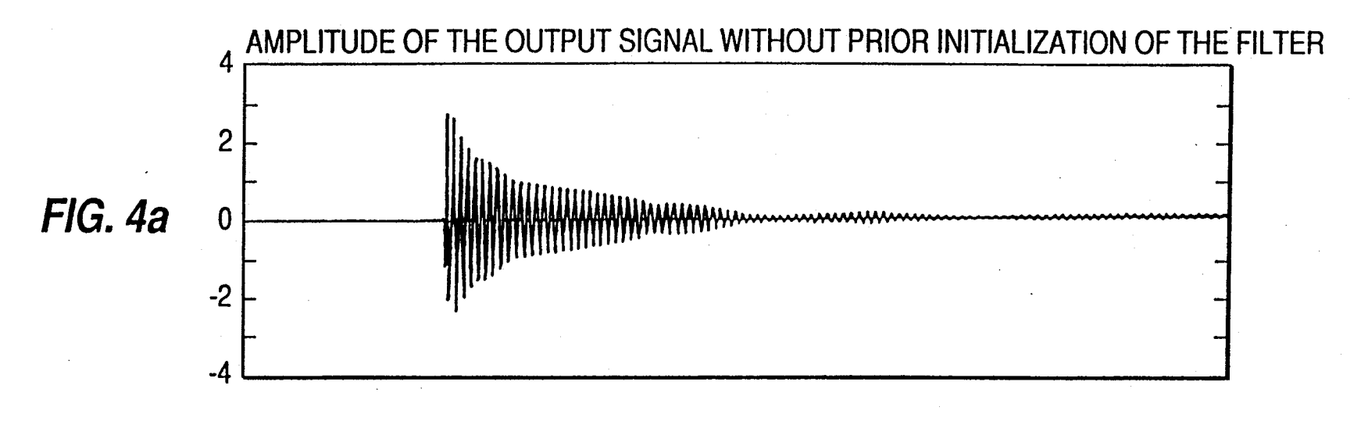
Figure 4B:
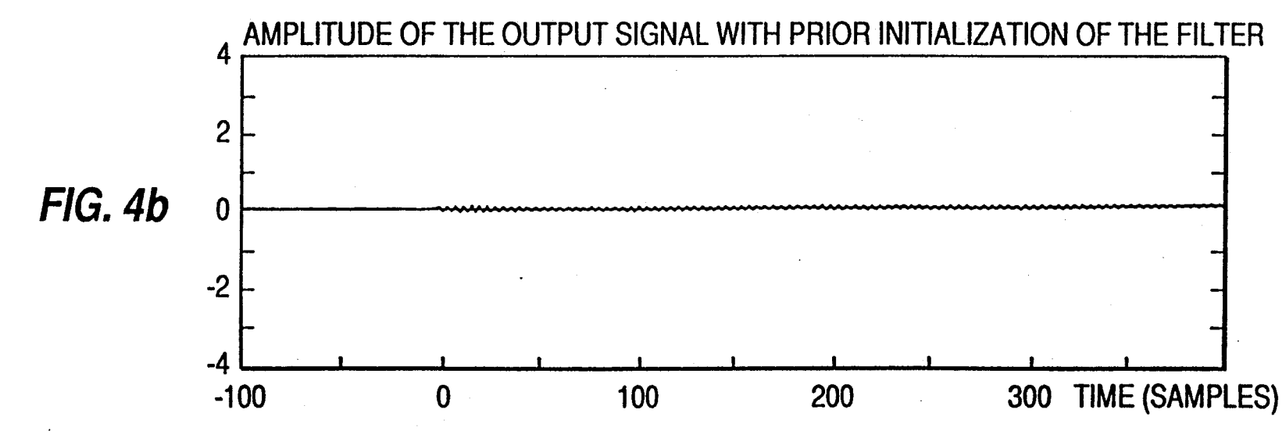

In the case corresponding to FIGS. 4a and 4b it is assumed that no interference signal, particularly no noise, is superposed on the monochromatic signal.

In the examples below according to FIGS. 5a to 8b, it is described how noise superposed on the monochromatic signal influences the measurement of real amplitude, phase and frequency and how thus caused inaccuracies influence the setting of the states.

If the monochromatic signal has noise $r(n)$ superposed on it, the switched-in input signal $x(n)$ can be represented by the following equation:

$$x(n) = A e^{j(\Omega n + \Phi_1)} + r(n) \text{ where } n \geq 0$$

$$x(n) = 0 \text{ where } n < 0 \quad (22)$$

In that case, the initial states required for measuring the real amplitude, phase and frequency of the monochromatic signal can no longer be determined with sufficient accuracy so that the pre-setting of the states of the IIR filter is correspondingly inaccurate. The precise determination of the initial states $x(0)$ and $x(1)$ is a function of the signal to noise ratio SNR which is defined by the following equations:

$$SNR = \frac{A^2}{\sigma_n^2}; \sigma_n^2 = E(|r(n)|^2) \quad (23)$$

where $\sigma_n^2$ is the variance and E the expected value.

Figure 5A:
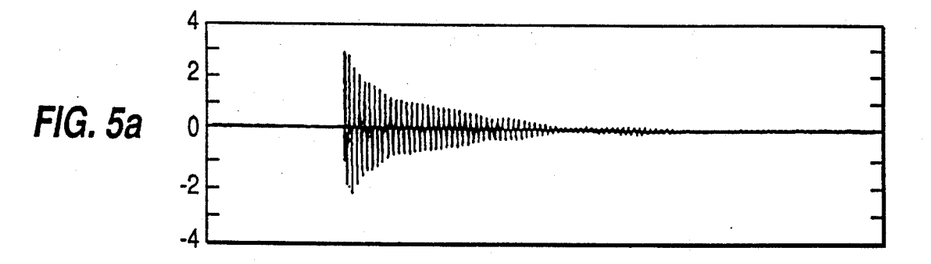
Figure 5B:
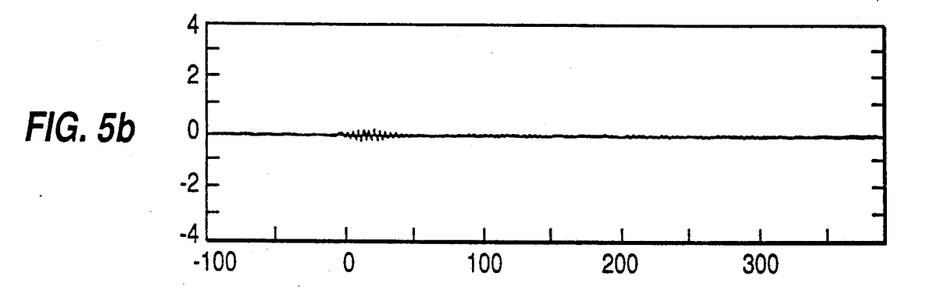
Figure 6A:
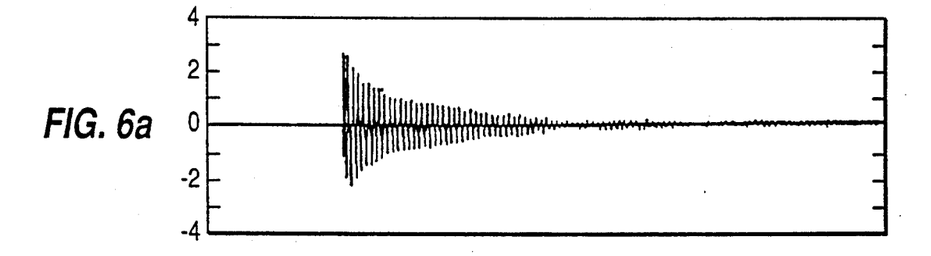
Figure 6B:
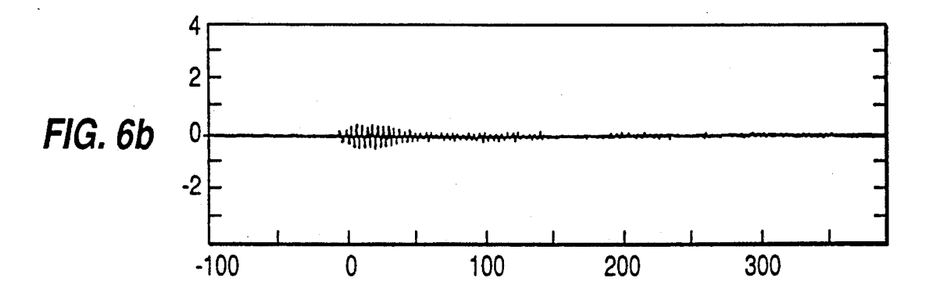
Figure 7A:
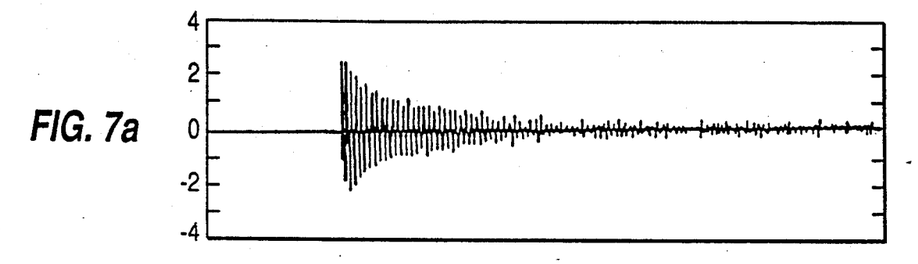
Figure 7B:
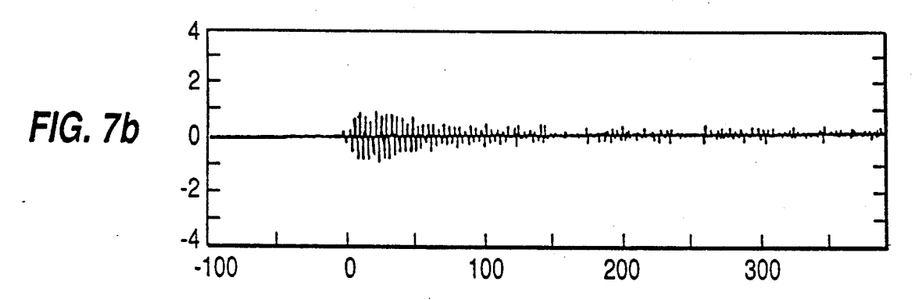
Figure 8A:
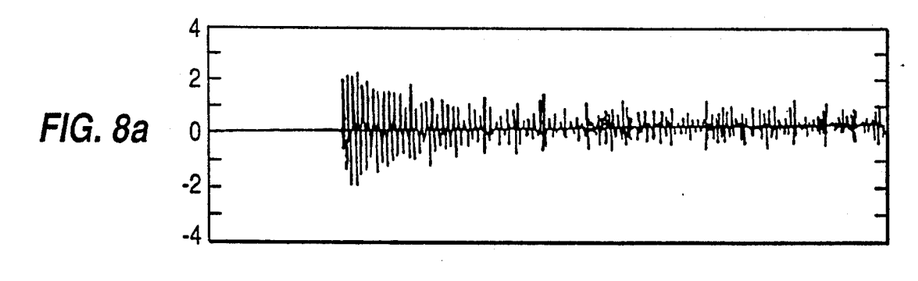
Figure 8B:
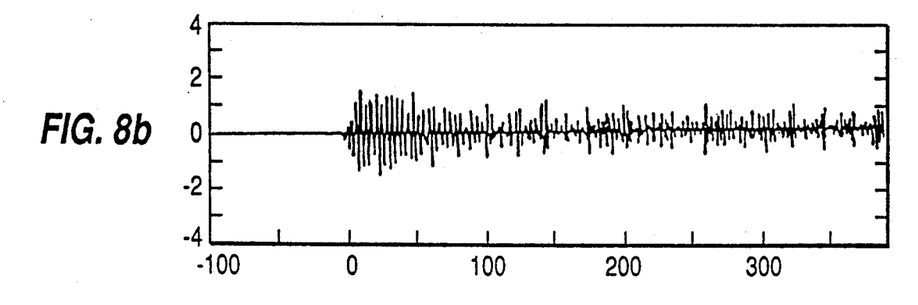

The examples of FIGS. 5a to 8b show the transient behavior of an IIR filter with the following filter parameters: sixth order elliptical filter, highpass filter, passband ripple 1 dB, stop band attenuation [attenuation in the suppressed band] 30 dB, stop frequency $\Omega_s = 0.15\pi$, transition range ratio $K = \Omega_S/\Omega_p = 0.98$) for signals corresponding to different SNRs which are described later. The illustration of FIG. 4 corresponds to infinite SNR. FIGS. 5a, 6a, 7a and 8a relate to an IIR filter without preset states, while FIGS. 5b, 6b, 7b and 8b relate to an IIR filter with preset states. The transient behavior is shown in FIGS. 5a, 5b for SNR=50 dB;
FIGS. 6a, 6b for SNR=40 dB;
FIGS. 7a, 7b for SNR=30 dB; and
FIGS. 8a, 8b for SNR=20 dB.

It can be seen that up to a signal to noise ratio of 30 dB (FIGS. 7a, 7b) the transient period of preset IIR filters is shortened considerably in an advantageous manner.

The present invention is not limited to the described embodiments but is applicable to others as well.

According to another aspect of the invention, the monochromatic signal component is converted by means of a sampling process into a time sequence of sampled values, and the real amplitude, phase and frequency of the monochromatic signal component are determined from two adjacent sampled values. For implementation of RE (FIGS. 1, 2) all floating point digital signal processors are possible for example TMS 320630 from Texas Instruments,
DSP 967002 from Motorola or
ADSP-21020 from Analog Devices.

The same types of floating point digital signal processors can be used to implement a digital filter in the form of an infinite impulse response filter.

Obviously, numerous and additional modifications and variations of the present invention are possible in light of the above teachings. It is therefore to be understood that within the scope of the appended claims, the invention may be practiced otherwise than as specifically claimed.

What is claimed is:

1. A method of processing a signal having a monochromatic signal component with the aid of a digital filter, comprising steps of:
   determining real amplitude, phase and frequency of the monochromatic signal component of the signal;
   time delaying the signal and setting states of the digital filter to correspond to the determined real amplitude, phase and frequency of the monochromatic signal component while the signal is delayed; and
   applying the signal to the input of the digital filter only after said setting step is completed.

2. A method as defined in claim 1, further comprising providing an infinite impulse response filter for the digital filter.

3. A method as defined in claim 2, wherein the step of providing an infinite impulse response filter comprises providing an infinite impulse response filter configured in a second direct form.

4. A method as defined claim 1, further comprising providing a cascade structure including at least one subsystem which is configured in the second direct form for the digital filter.

5. A method as defined in claim 1, further comprising:
   performing a sampling process to convert at least the monochromatic signal component into a time sequence of sampled values; and
   determining the real amplitude, phase and frequency of the monochromatic signal component from two adjacent sampled values.

6. A method as defined in claim 1, further comprising setting the states of the digital filter by way of programmable memory elements.

* * * * *